United States Patent
Sanders et al.

(10) Patent No.: US 9,698,131 B2
(45) Date of Patent: Jul. 4, 2017

(54) METHODS OF FORMING 3-D CIRCUITS WITH INTEGRATED PASSIVE DEVICES

(71) Applicant: Invensas Corporation, San Jose, CA (US)

(72) Inventors: Paul W. Sanders, Scottsdale, AZ (US); Robert E. Jones, Colorado Springs, CO (US); Michael F. Petras, Phoenix, AZ (US); Chandrasekaram Ramiah, Phoenix, AZ (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/977,214

(22) Filed: Dec. 21, 2015

(65) Prior Publication Data
US 2016/0111404 A1    Apr. 21, 2016

Related U.S. Application Data

(60) Continuation of application No. 14/275,678, filed on May 12, 2014, now Pat. No. 9,236,365, which is a
(Continued)

(51) Int. Cl.
*H01L 25/16* (2006.01)
*H01L 21/683* (2006.01)
(Continued)

(52) U.S. Cl.
CPC ........ *H01L 25/162* (2013.01); *H01L 21/6835* (2013.01); *H01L 21/76898* (2013.01);
(Continued)

(58) Field of Classification Search
CPC ............... H01L 25/162; H01L 21/6853; H01L 21/76898
(Continued)

(56) References Cited

U.S. PATENT DOCUMENTS

| 5,501,893 A | 3/1996 | Laermer et al. |
| 6,790,748 B2 | 9/2004 | Kim et al. |

(Continued)

FOREIGN PATENT DOCUMENTS

| WO | WO 2004/111659 | 12/2004 |
| WO | WO 2005/004195 | 1/2005 |

(Continued)

OTHER PUBLICATIONS

Hoshino, M, et al., Wafer Process and Issue of Through Eletrode in Si wafer using Cu Damascene for Three Dimensional Chip Stacking, 0-7803-7216-6/02 IEEE, Jun. 2002.
(Continued)

*Primary Examiner* — Errol Fernandes
(74) *Attorney, Agent, or Firm* — Haynes and Boone, LLP

(57) ABSTRACT

Methods of forming 3-D ICs with integrated passive devices (IPDs) include stacking separately prefabricated substrates coupled by through-substrates-vias (TSVs). An active device (AD) substrate has contacts on its upper portion. An isolator substrate is bonded to the AD substrate so the TSVs in the isolator substrate are coupled to the contacts on the AD substrate. An IPD substrate is bonded to the isolator substrate so that TVs therein are coupled to an interconnect zone on the isolator substrate and/or TSVs therein. The IPDs of the IPD substrate are coupled by TSVs in the IPD and isolator substrates to devices in the AD substrate. The isolator substrate provides superior IPD to AD cross-talk attenuation while permitting each substrate to have small high aspect ratio TSVs, thus facilitating high circuit packing density and efficient manufacturing.

24 Claims, 9 Drawing Sheets

Related U.S. Application Data continuation of application No. 13/731,242, filed on Dec. 31, 2012, now Pat. No. 8,722,459, which is a division of application No. 12/277,519, filed on Nov. 25, 2008, now Pat. No. 8,344,503.

(51) Int. Cl.
| | |
|---|---|
| H01L 21/768 | (2006.01) |
| H01L 23/48 | (2006.01) |
| H01L 23/00 | (2006.01) |
| H01L 25/065 | (2006.01) |
| H01L 25/00 | (2006.01) |
| H01L 49/02 | (2006.01) |
| H01L 23/538 | (2006.01) |
| H01L 23/58 | (2006.01) |
| H01L 27/06 | (2006.01) |
| H01L 23/367 | (2006.01) |
| H01L 27/02 | (2006.01) |

(52) U.S. Cl.
CPC ........ *H01L 23/3675* (2013.01); *H01L 23/481* (2013.01); *H01L 23/5384* (2013.01); *H01L 23/58* (2013.01); *H01L 24/05* (2013.01); *H01L 24/11* (2013.01); *H01L 24/16* (2013.01); *H01L 24/81* (2013.01); *H01L 24/94* (2013.01); *H01L 24/97* (2013.01); *H01L 25/0652* (2013.01); *H01L 25/0657* (2013.01); *H01L 25/50* (2013.01); *H01L 27/0296* (2013.01); *H01L 27/0629* (2013.01); *H01L 28/00* (2013.01); *H01L 2221/6835* (2013.01); *H01L 2221/68381* (2013.01); *H01L 2224/0401* (2013.01); *H01L 2224/0557* (2013.01); *H01L 2224/05552* (2013.01); *H01L 2224/1147* (2013.01); *H01L 2224/13009* (2013.01); *H01L 2224/13025* (2013.01); *H01L 2224/13147* (2013.01); *H01L 2224/16503* (2013.01); *H01L 2224/81203* (2013.01); *H01L 2224/81801* (2013.01); *H01L 2224/81894* (2013.01); *H01L 2224/83365* (2013.01); *H01L 2224/83385* (2013.01); *H01L 2224/97* (2013.01); *H01L 2225/06513* (2013.01); *H01L 2225/06541* (2013.01); *H01L 2225/06572* (2013.01); *H01L 2924/0002* (2013.01); *H01L 2924/00013* (2013.01); *H01L 2924/00014* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01014* (2013.01); *H01L 2924/01018* (2013.01); *H01L 2924/01021* (2013.01); *H01L 2924/01022* (2013.01); *H01L 2924/01029* (2013.01); *H01L 2924/01033* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01327* (2013.01); *H01L 2924/04941* (2013.01); *H01L 2924/04953* (2013.01); *H01L 2924/05042* (2013.01); *H01L 2924/09701* (2013.01); *H01L 2924/12044* (2013.01); *H01L 2924/14* (2013.01); *H01L 2924/19041* (2013.01); *H01L 2924/19042* (2013.01); *H01L 2924/19043* (2013.01); *H01L 2924/3011* (2013.01); *H01L 2924/3025* (2013.01); *H01L 2924/30105* (2013.01)

(58) Field of Classification Search
USPC ....... 257/621, 659, 686, 692, 700, 724, 774, 257/778; 438/107, 667
See application file for complete search history.

(56) References Cited

U.S. PATENT DOCUMENTS

| | | |
|---|---|---|
| 6,800,930 B2 | 10/2004 | Jackson et al. |
| 6,838,776 B2 | 1/2005 | Leal et al. |
| 6,841,413 B2 | 1/2005 | Liu et al. |
| 6,876,056 B2 | 4/2005 | Tilmans et al. |
| 6,908,565 B2 | 6/2005 | Kim et al. |
| 6,921,975 B2 | 7/2005 | Leal et al. |
| 6,962,867 B2 | 11/2005 | Jackson et al. |
| 6,972,480 B2 | 12/2005 | Zilber et al. |
| 7,042,084 B2 | 5/2006 | Takeuchi |
| 7,221,034 B2 | 5/2007 | Ma et al. |
| 7,335,986 B1 | 2/2008 | Paek et al. |
| 7,351,068 B2 | 4/2008 | Sukegawa et al. |
| 7,355,273 B2 | 4/2008 | Jackson et al. |
| 7,368,311 B2 | 5/2008 | Tilmans et al. |
| 8,653,648 B2 | 2/2014 | Chen et al. |
| 2004/0118806 A1 | 6/2004 | Kim et al. |
| 2004/0121556 A1 | 6/2004 | Kim et al. |
| 2005/0214978 A1 | 9/2005 | Taggart et al. |
| 2006/0205161 A1 | 9/2006 | Das et al. |
| 2006/0252262 A1 | 11/2006 | Kazemi et al. |
| 2007/0121273 A1 | 5/2007 | Yamamoto et al. |
| 2007/0158787 A1 | 7/2007 | Chanchani |
| 2007/0170583 A1* | 7/2007 | Kwon ................ H01L 23/4334 257/724 |
| 2007/0184677 A1 | 8/2007 | Sukegawa et al. |
| 2007/0215976 A1 | 9/2007 | Degani et al. |
| 2008/0061427 A1 | 3/2008 | Chiang |
| 2008/0157787 A1 | 7/2008 | Misra et al. |
| 2009/0302435 A1 | 12/2009 | Pagaila et al. |

FOREIGN PATENT DOCUMENTS

| | | |
|---|---|---|
| WO | WO 2006/124597 | 11/2006 |
| WO | WO 2007/106625 | 9/2007 |

OTHER PUBLICATIONS

Puech, J, High Productivity ORIE solutions for 30-SiP and MEMS Volume Manufacturing, Institute of Physics Publishing; Journal of Physics: Conference Series 34, May 2006, 481-486.
Chambers, A.,et al., Si ORIE for Through-wafer via Fabrication, Retreived from the internet: http://ap.pennnet.com/ Articles/Article_Display .cfm?Section=ARCH I&ARTI CLE I 0=249864& VERSION_NU M=2&p=36, Nov. 2008.
MEPTEC Report, vol. 11,No. 1, Quarter 1, 2007,5th Annual MEMS Symposium, Retrieved the internet, www.meptec.com, Nov. 2008.
Braunisch, H.,et al., Electrical Performance of Bumpless Build-Up Layer Packaging, Intel Corporation, May 2002.
Towle, S., et al., Bumpless Build-Up Layer Packaging, Intel Corporation, Nov. 2008.
Intel Press Room Backgrounder—BBUL Packaging, Intel Corporation, Nov. 2008.
Katehi, L, et al., 3-D Integration of RF Circuits Using Si Micromachining, 1527-3342 IEEE, Mar. 2001.
Hella, M.M., "Die-on-wafer and Wafer-level 30 Integration for Millimeter-Wave Smart Antenna Transceivers", IEEE, WAMICON, 2005.

* cited by examiner

METHODS OF FORMING 3-D CIRCUITS WITH INTEGRATED PASSIVE DEVICES

RELATED APPLICATION

The present application is a continuation of U.S. patent application Ser. No. 14/275,678, filed May 12, 2014, incorporated herein by reference, which is a continuation of U.S. patent application Ser. No. 13/731,242, filed Dec. 31, 2012, incorporated herein by reference, now U.S. Pat. No. 8,722, 459, which is a division of U.S. patent application Ser. No. 12/277,519, filed Nov. 25, 2008, incorporated herein by reference, now U.S. Pat. No. 8,344,503.

FIELD OF THE INVENTION

The present invention generally relates to electronic devices and integrated circuits (ICs) and their methods of manufacture, and more particularly, structures and methods for (3-D) integrated circuits (ICs) incorporating integrated passive devices (IPDs).

BACKGROUND OF THE INVENTION

As modern electronic devices, especially integrated circuits (ICs), become more complex there is a great need to extend circuit integration into three dimensions. This is especially true of devices and circuits that operate at high frequencies where there is often a need to include integrated passive devices (e.g., inductors, capacitors, resistors, transmission lines, ground planes, shielding structures, baluns, etc.) that cannot easily be provided as a part of the associated semiconductor devices. Accordingly, such integrated passive devices (IPDs) are often formed in dielectric and metal layers above the semiconductor substrate in or on which the active devices, e.g., transistors of various kinds, are formed. (As used herein, the term "transistor" singular or plural, is intended to include any type of semiconductor device having two or more terminals.) The greater the number and complexity of the integrated passive devices (IPDs), the greater the need to extend the integrated circuit structure into the third dimension perpendicular to the surface of the surface of the underlying semiconductor devices. Such devices and circuits are referred to as "3-D integrated circuits" or "3-D ICs".

Creating effective 3-D ICs incorporating high frequency power amplifiers has proved especially difficult because of electromagnetic (EM) cross-talk among the various components and higher than desired losses arising from stray electromagnetic (EM) fields inducing undesirable eddy currents in underlying semiconductor substrates. These effects can limit the gain and efficiency of high frequency power amplifier. These effects are especially pronounced with advanced LDMOS (laterally diffused metal oxide semiconductor) integrated power amplifiers that employ high resistivity (e.g., semi-insulating) substrates. The thicker the substrate the greater the decoupling and the higher the quality factor Q of the associated integrated passive devices (IPDs). The quality factor Q is a measure of the energy stored divided by the energy dissipated per cycle by a resonant element, such as for example (but not limited to) an inductor. However, use of thicker substrates creates other problems, such as for example, increased thermal impedance between power amplifier active device (AD) regions on or near a front face of the substrate and a heat sink coupled to a rear face of the substrate. This increased thermal impedance can degrade overall performance. Thus, power amplifier ICs embodying IPDs involve conflicting requirements. For example, active device (AD) performance is generally optimized by using thinner substrates for efficient heat extraction, while integrated passive device (IPD) performance is generally optimized by using thicker substrates. 3-D integration attempts to avoid this conflict by moving the IPDs to layers above the active devices. However, there are physical limits on the number and thickness of multilayer dielectric-metal stacks for IPDs that can be deposited on a semiconductor substrate containing active devices (ADs). This can make it difficult or impossible, for example, to reduce the cross-talk among the IPDs and/or between the IPDs and the underlying ADs and their substrate. Thus, a need continues to exist for improved 3-D IC structures and methods where undesirable electromagnetic cross-talk and thermal impedance effects are simultaneously minimized or avoided. This is especially true in the case of high frequency power amplifiers where cross-talk, thermal impedance and other present day limitations are acutely felt.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
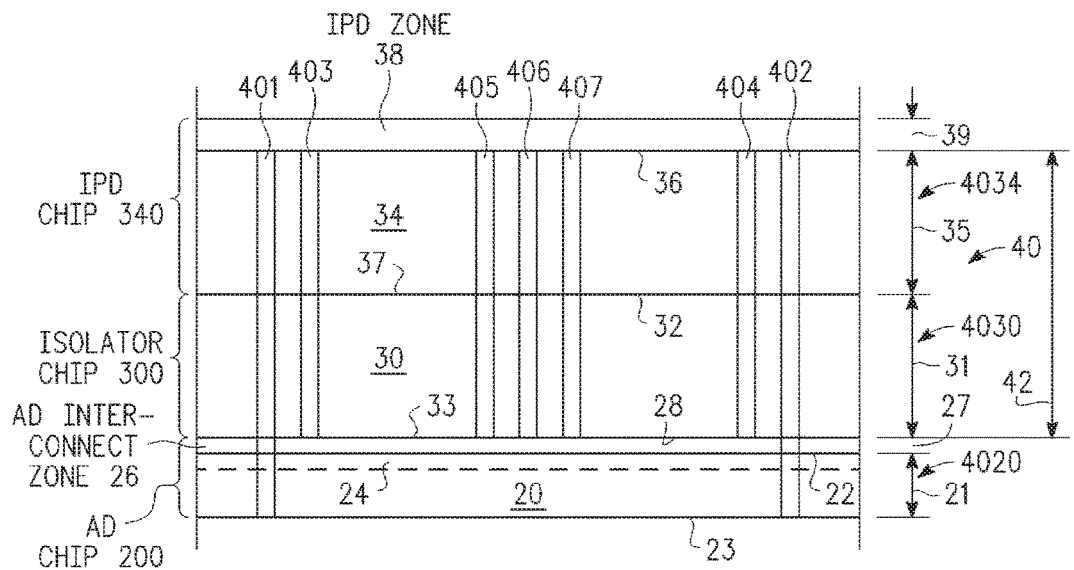
FIG. 1 is a simplified schematic cross-sectional view of a generalized 3-D IC comprising an active device (AD) chip, an isolator chip and an integrated passive device (IPD) chip, coupled by conductive vias, according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing among similar elements and not necessarily for describing a particular sequential or chronological order.

It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting, semiconductor-on-insulator (SOI) structures, and combinations thereof. The term "semiconductor" is abbreviated as "SC." Unless otherwise specifically noted, the term "oxide" is intended to include any form of insulating dielectric whether organic or inorganic, and the terms "metal," "metal layers," "metallization" and "metallization layers" are intended to include any type of electrical conductor, whether organic or inorganic, metallic or non-metallic. Non-limiting examples of such conductors are doped semiconductors, semi-metals, alloys and mixtures, combinations thereof, and so forth. For convenience of explanation and not intended to be limiting, semiconductor devices and methods of fabrication may be described herein for silicon semiconductors but persons of skill in the art will understand that other semiconductor materials can also be used.

Attempts have been made in the past to mitigate cross-talk problems by forming the IPDs on a separate fully optimized substrate, thereby creating an "IPD chip" that is vertically stacked on top of the active device (AD) substrate (an "AD chip"), and electrically coupling the two chips so as to tie the passive and active devices together in the desired manner. It is this integrated coupling of the optimized IPD and AD chips that has proved to be especially difficult. If wire bonding or solder bumps or other typical "back-end" manufacturing techniques are used, the advantages of advanced batch wafer processing are often lost. It is known to use conductor filled vias through SC wafers and other substrates as a means of providing electrical and thermal connections between the front and rear surfaces of the wafer or substrate and various components thereon. These are referred to as "through-semiconductor-vias" or "through substrate vias", abbreviated as "TSVs". Thus, TSVs could be used to couple IPDs on the front surface of an IPD chip to the rear surface of the IPD chip where they could be coupled to matching connections on an underlying active device (AD) chip, using batch fabrication techniques. However, the available manufacturing technology for forming TSVs creates several design and manufacturing conflicts that must be overcome to obtain space efficient chips and cost-effecting manufacturing. These have to do with the relationship between wafer thickness and TSV size and ease of formation. The thicker the wafer, the more difficult it is to form small area, high aspect ratio (AR) TSVs. The aspect ratio (AR) is given by the TSV depth d divided by the TSV width w, that is $AR=d/w$. Comparatively thick IPD wafers are desirable in order to minimize cross-talk to the underlying AD wafer or chip and to minimize breakage during manufacturing. (It is well known that thin wafers or substrates have higher manufacturing breakage rates.) If, for these reasons, thicker IPD wafers or substrates are used, the TSVs have lower ARs and larger areas, thereby resulting in greater overall chip area and higher cost for the same functionality. This is undesirable. Thus, there is a need for structures and manufacturing methods that avoid the conflict between IPD wafer or substrate thickness and TSVs aspect ratio and lateral size.

In connection with the figures that follow, the terms "wafer" and "substrate" are used interchangeably. Further, in describing how the various elements making up a 3-D IC are fabricated, it is understood that during manufacture a "substrate" or "wafer" may contain many "chips" that are being formed simultaneously and that will eventually be separated into individual components or integrated circuits. The 3-D ICs described herein comprise several stacked chips interconnected via TSVs. They may be assembled (stacked and interconnected) while still in wafer form and the stacked wafers then singulated into the individual 3-D IC's, or the individual chips making up the 3-D ICs may be first singulated from their parent wafers before being stacked and interconnected in chip form to provide the 3-D ICs. Additionally, singulated chips can be stacked on an un-singulated wafer in a chip-on-wafer integration arrangement. The bottom wafer is later singulated to form the 3-D ICs. All of these arrangements are useful. Thus, even though elements making up various levels of the 3-D IC may be referred to as "chips" or "substrates" or "wafers" in describing the manufacturing process, they remain in wafer form until ready to be stacked and interconnected and can be stacked and interconnected before or after singulation.

FIG. 1 is a simplified schematic cross-sectional view of a portion of generalized 3-D integrated circuit (IC) 18 comprising integrated passive device (IPD) chip 340 having IPD substrate 34 with IPD zone 38 thereon, isolator chip 300 having isolator substrate 30 and active device (AD) chip 200 having active device (AD) substrate 20, stacked one upon the other and coupled by conductive vias (i.e., TSVs) 40, according to an embodiment of the present invention. IPD zone 38 is the region of 3-D IC 18 in which the passive components are primarily located. In various implementations IPD zone 38 can comprise various metal, dielectric and other layers arranged to provide, for example and not intended to be limiting, inductors, capacitors, interconnections, resistors, transmission lines, couplers, splitters, baluns, and/or other well known passive components. For the purposes of the present invention it is assumed that IPD zone 38 can contain integrated passive devices (IPDs) of various kinds. The present invention does not depend on the exact nature of these integrated passive devices (IPDs).

With respect to the TSVs, the reference number 40 is used to refer to TSVs generally. The convention is adopted of identifying the TSVs within each substrate by adding the substrate reference number, whereby TSVs 4020 refer collectively to those TSVs passing through substrate 20, TSVs 4030 refer collectively to those TSVs passing through isolator substrate 30, and TSVs 4034 refer collectively to those TSVs passing through IPD substrate 34. Reference numbers 401 through 407 refer to TSVs that are coupled so as to pass through several levels of 3-D IC 18. For example, TSV 401 at the left of 3-D IC 18 (and TSV 402 at the right of 3-D IC 18) has a TSV segment within AD substrate 20 that is coupled to a TSV segment above it passing through isolator substrate 30 that is in turn coupled to a further TSV segment above it within IPD substrate 34, so as to provide electrical continuity extending from IPD zone 38 on top of IPD substrate 34 to lower surface 23 of AD substrate 20. Analogously, TSVs 403-407 extend from IPD zone 38 to AD interconnect zone 26, providing electrical continuity therebetween. In a preferred embodiment IPD substrate 34 and the isolator chip substrate 30 will both be high resistivity semiconductors. For example if the substrates are formed of silicon, the resistivity in this preferred embodiment will be 1000 ohm-cm or higher. Thickness 35 of the IPD substrate 34 typically will be between 10 and 200 micrometers or larger and preferably between 40 and 100 micrometers. Thickness 31 of the isolator chip substrate 30 typically will be between 10 and 200 micrometers or larger and preferably will be between 40 and 100 micrometers. The TSVs illustrated in FIG. 1 are intended to merely be examples of TSVs extending through various layers of the third dimension of a 3-D IC and not to be limited merely to what is shown. Persons of skill in the art will understand based on the description herein, that TSVs can be arranged to penetrate any combination of the various superposed layers or regions of any 3-D IC and that they need not be all arranged vertically one above the other as illustrated herein but can be off-set by providing horizontal metal leads coupling a TSV in a higher layer to an off-set TSV in a lower layer at an interface between superposed layers or regions (e.g., see FIG. 2).

Active device (AD) substrate 20 of thickness 21, with upper surface 22 and lower surface 23 has, in this example, active devices located generally in zone 24 proximate upper surface 22, but in other embodiments, the active devices may be distributed more generally through substrate 20. Such active devices can include any kind of transistor(s) and such associated passive devices as are incorporated within or on substrate 20, using means well known in the art, and the term "active devices" and the abbreviation "AD" are intended to be inclusive of such other elements. The present invention does not depend upon the particular type or types of active devices included in substrate 20. Substrate 20 generally comprises a semiconductor in which the active devices are formed. Silicon is a non-limiting example of a suitable semiconductor for substrate 20, but other semiconductor materials may also be used. As noted earlier, LDMOS power amplifiers are non-limiting examples of the kinds of devices that can be used in active device (AD) zone 24 of substrate 20, in which case, it is desirable that substrate 20 be of a semi-insulating semiconductor material, e.g., of a resistivity equal or greater than about 1000 ohm-cm. However, in other integrations, an LDMOS substrate may have a lower resistivity, for example and not intended to be limiting, in the range of 10 milliohm-cm to 10 ohm-cm. In yet other applications, active device substrate 20 may have a different resistivity as appropriate for formation of the actives devices in the AD zone 24. For example, the resistivity of active device substrate 20 may typically be of the order of about 10 ohm-cm for a silicon CMOS (complementary metal oxide semiconductor) AD substrate 20. In general, it is desirable that substrate 20 be significantly thinner than substrates 30 and/or 34, to facilitate heat removal from active device region 24 while at the same time providing good RF isolation between IPD zone 38 and AD interconnect zone 26 and device region 24 of substrate 20. In these circumstances it is desirable that thickness 31 of isolator substrate 30 and/or thickness 35 of IPD substrate 34 be in the range of at least about 2 to 20 times thickness 21 of AD substrate 20, more preferably at least about 5-15 times thickness 21 and preferably at least about 10 times thickness 21 of substrate 20.

In a preferred embodiment, active device (AD) interconnect zone 26 of thickness 27 is desirably provided on upper surface 22 of AD substrate 20. AD interconnect zone 26 may comprise only a single level of metallization or include multilayers of metallization. Its purpose is to connect the various devices included in AD substrate 20 to each other and to some or all of conductive vias 40 that extend to higher regions of 3-D IC 18 and/or to lower surface 23 of AD substrate 20, the details of which will depend upon the particular electrical function being provided. It is assumed that the active devices included in region 24 of substrate 20 will have contact regions on surface 22 to which the various metal leads provided in AD interconnect zone 26 are coupled. Such contact regions are routinely provided for semiconductor devices and integrated circuits. However, in other embodiments, conductive vias 40 may be coupled directly to such contact regions and AD interconnect zone 26 may be omitted or only have a single metal level, depending upon the IC function that is being implemented. Thickness 21 of AD substrate 20 can therefore be optimized (e.g., made much thinner) to facilitate efficient heat removal. As will be subsequently explained, the manufacturing methods described herein facilitate providing thin semiconductor substrates having space-efficient (small area) TSVs therein while avoiding the higher breakage rates during manufacturing usually associated with thin substrates.

Isolator substrate 30 has thickness 31, upper surface 32 and lower surface 33 and includes TSVs 4030 aligned either with one or more of TSVs 4020 of substrate 20 (as for example for TSVs 401, 402) and/or with contact regions of AD interconnect zone 26 and IPD zone 38 (as for example with TSVs 403-407). Among other things, a purpose of isolator substrate 30 of thickness 31 is to provide adequate separation between IPD zone 38 and AD interconnect zone 26 and/or substrate 20 so as to mitigate or eliminate stray electromagnetic coupling (e.g., cross-talk) between IPD zone 38 and AD interconnect zone 26 and/or substrate 20 with device layer 24, while still allowing IPD substrate 34 to be sufficiently thin so that high aspect ratio TSVs can be formed therein. Stated another way, isolator substrate 30 allows the TSV formation and IPD substrate thickness to be simultaneously optimized without conflict.

For example, suppose that distance 42 between IPD zone 38 and AD interconnect zone 33 (or substrate 20) needs to be equal to twice thickness 35 of IPD substrate 34 in order to sufficiently attenuate stray electromagnetic fields generated in IPD zone 38 so that cross-talk is minimized. If one attempts to achieve this by doubling the thickness of IPD substrate 34, it becomes extremely difficult to efficiently fabricate TSVs 4034 through IPD substrate 34. The aspect ratio of such double-depth TSVs will be much lower, the area of each such TSV must be substantially larger and they must be placed further apart. As a consequence, the packing efficiency of the 3-D IC would be significantly degraded and the overall fabrication time would be greatly increased (it takes much longer to fill deep vias with conductors). Thus, the desired design and cost objectives may be unreachable with such an approach. These problems are avoided by providing isolator substrate 30 between IPD substrate 34 and AD interconnect zone 26 and underlying AD substrate 20. Thickness 31 of substrate 30 plus thickness 35 of IPD substrate together provide the total separation 42 that is needed for avoiding the unwanted EM coupling. At the same time, thickness 35 and thickness 31 can both be in the zone where small diameter high aspect ratio TSV can be easily and efficiently fabricated, thus preserving the desired IC packing density. IPD substrate 34 having thereon IPD zone 38 is bonded to isolator substrate 30 such that the desired ones of TSVs 4034 and 4030 are aligned and connected. Thus, separation 42 needed to reduce EM coupling is achieved while still being able to provide the needed electrical continuity between passive devices in IPD zone 38 and the conductors in AD interconnect zone 26 and devices in underlying AD substrate 20. This is a significant advance over the prior art.

Figure 2:
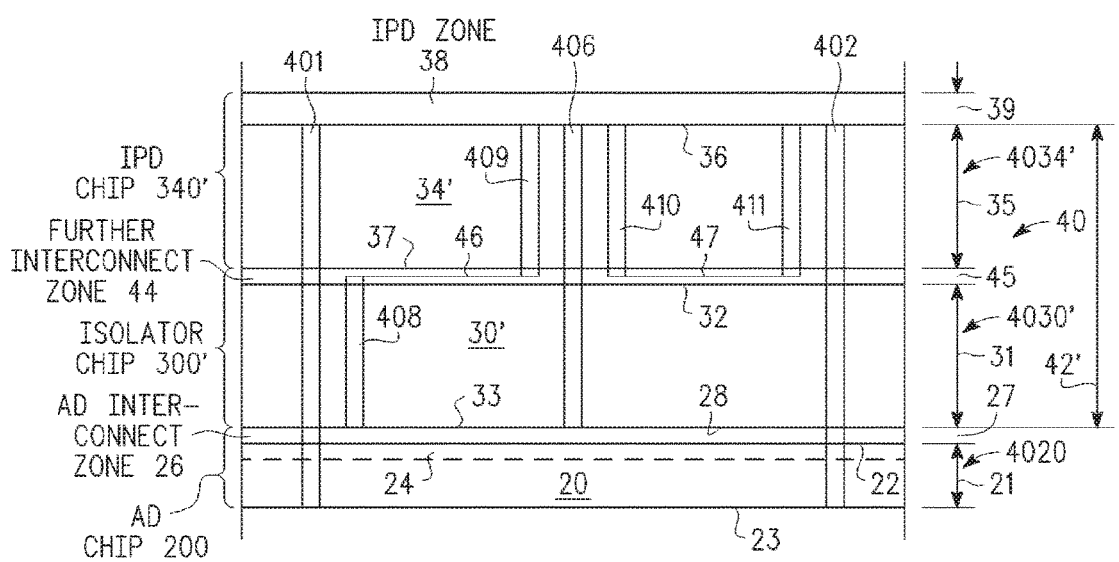
FIG. 2 is a simplified schematic cross-sectional view of a generalized 3-D IC comprising an active device (AD) chip, an isolator chip and an integrated passive device (IPD) chip, coupled by conductive vias, according to a further embodiment of the present invention.

FIG. 2 is a simplified schematic cross-sectional view of a portion of generalized 3-D integrated circuit (IC) 18' comprising integrated passive device (IPD) chip 340' having IPD substrate 34' with IPD zone 38 thereon, isolator chip 300' having substrate 30' and active device (AD) chip 200, stacked one upon the other and coupled by conductive vias (i.e., TSVs) 40, according to a further embodiment of the present invention. Like reference numbers are used to identify similar elements in FIGS. 1 and 2 and primes (') are added to the reference numbers of some otherwise analogous elements (e.g., 30 and 30'; 300 and 300'; 42 and 42', etc.) that differ somewhat in the embodiment of FIG. 2. The discussion of FIG. 1 is incorporated herein by reference. 3-D IC 18' of FIG. 2 differs from that of FIG. 1 by inclusion of further interconnect zone 44 of thickness 45 between substrate 30' and IPD substrate 34' of IPD chip 340'. Thickness 42' is the sum of thicknesses 31, 45 and 35. Further interconnect zone 44 is created in the same general manner as AD interconnect zone 26, except that it can provide lateral connection between some of TSVs 4030' and other of TSVs 4034' that are not vertically aligned. While it is possible to form further interconnect zone 44 on the bottom of IPD substrate 34', in a preferred embodiment, further interconnect zone 44 is desirably formed on top of substrate 30' of isolator chip 300'. For example, TSV 408 in isolator substrate 30' couples contacts in AD interconnect zone 26 (and/or underlying devices in substrate 22) to horizontal conductor 46 in further interconnect zone 44, which in turn is connected to TSV 409 in IPD substrate 34' that is coupled to contacts in overlying IPD zone 38. This permits electrical connections between substrate 20 and IPD zone 38 to be made even when the desired contact regions cannot for some other reason be vertically aligned. An additional benefit of further interconnect layer 44 is that lateral metallization regions may be provided therein to act as ground planes or electrical shields or cross-unders or cross-overs or parts of transmission lines or combinations thereof, where such functions are needed. Since they are separated from the circuit being shielded in either AD interconnect zone 26 and/or IPD zone 38 by substrate thickness 31 and/or 35, they can have lower capacitance than if they were required to be a part of AD interconnect zone 26 and/or IPD zone 38 where inter-level dielectric layers are much thinner than dimensions 31 and/or 35. Thus, electromagnetic or RF circuit elements can be formed wherein one portion of the desired circuit element is formed in IPD zone 38 of IPD chip 340' and another portion of the desired circuit element is formed in further interconnect zone 44 of isolator chip 300'. The vertical separation of the portions of such a circuit element thus includes thickness 35 of IPD substrate 34' and can be made greater than is generally practical within an interconnection zone formed on a single chip. For example, in an embodiment where the RF circuit element is a transmission line, one conductive strip of the transmission line can be formed in IPD zone 38 and a second conductive strip of the transmission line formed in further interconnect zone 44. This pair of conductive strips can be a differential signal pair or the conductive strip in further interconnect zone 44, for example, can be a ground.

In another embodiment, for example, the RF circuit element can be an inductor having a patterned ground plane with the inductor loop(s) in IPD zone 38 and the patterned ground plane in further interconnect zone 44, wherein the ground plane is patterned as is known in the art to reduce eddy current losses, and the relatively vertical distance 35 between the inductor loop(s) in IPD zone 38 and the patterned ground plane in further interconnect zone 44 reduces the capacitance of this RF circuit element. In a still further embodiment, for example, an electromagnetic band gap structure (e.g., one or more tuned elements) can be formed in further interconnect zone 44 to enhance the shielding of active device chip 200 and substrate 20 from stray electromagnetic fields originating from a passive structure in IPD zone 38. A still additional advantage of further interconnect zone 44 is that it can simplify the design of either or both of AD interconnect zone 26 and IPD zone 38 by providing a further level of conductive cross-unders or cross-overs or both, beyond those available within AD interconnect zone 26 and/or IPD zone 38. For example, TSV 410 connects a contact (not shown) in IPD zone 38 to lateral conductor 47 in further interconnect zone 44, which is in turn connected to TSV 411 that returns to another contact (not shown) in IPD zone 38 in a location laterally displaced from TSV 410, thereby providing a cross-under. A cross-over, e.g., for AD interconnect zone 26, can be provided in an analogous manner. Accordingly, some of the TSVs intersecting further interconnect zone 44 will pass through to TSVs in the next level vertically aligned therewith (e.g., 401, 402 and 406), while others can terminate (e.g., 408, 409, 410, 411) on lateral connections, e.g., connections 46, 47, within further interconnect zone 44 so that the conduction path to the next TSV is staggered (e.g., 408, 46, 409) or so that a cross-over or cross-under (e.g., 410, 47, 411) is formed. This combination of features greatly increases design flexibility. The foregoing are intended as non-limiting examples of what can be accomplished by providing isolator chip 300' with further interconnect zone 44 thereon.

Figure 3:
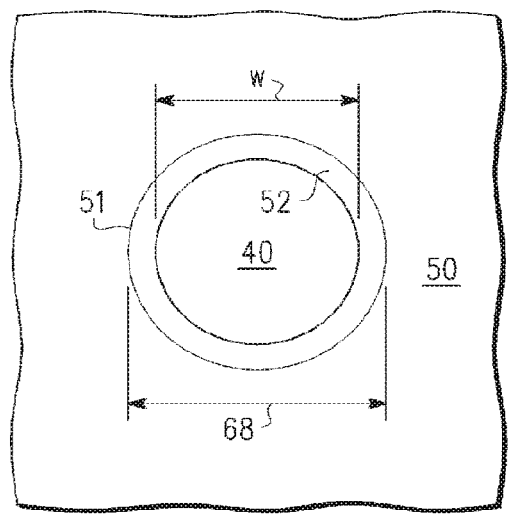
FIG. 3 is a simplified plan view of a typical through-substrate-via (TSV) employed in various embodiments of the present invention.

FIG. 3 is a simplified plan view of typical through-substrate-via (TSV) 40 of diameter or width w employed in various embodiments of the present invention. While TSV 40 is shown in FIG. 3 as having a circular plan view cross-section, this is merely for convenience of description and not intended to be limiting and TSVs 40 can have any plan view cross-sectional shape. Square, rectangular, polygonal, elliptical and so forth are non-limiting examples of other useful shapes. Region 50 extending laterally outside of periphery 51 of TSV 40 is where various interconnections can be formed in IPD zone 38, further interconnect zone 44 and/or AD interconnect zone 26. It is desirable for efficient circuit packing that TSVs 40 have width w in the range of about 1 to 100 micrometers more conveniently about 2 to 40 micrometers and preferably about 3 to 20 micrometers, and aspect ratios ARs of about 2:1 to 50:1, more conveniently about to 3:1 to 25:1 and preferably about 4:1 to 10:1 if the conductive fill material is, for example, plated copper and about 10:1 to 25:1 if the conductive fill material is, for example, chemical vapor deposited (CVD) tungsten. In the case of TSVs having non-uniform cross-sections such as trenches or annular shapes, the smaller cross section dimension is typically used in calculating the aspect ratio although it is recognized that the larger dimension in another direction can enhance the ability to fill a TSV with a greater aspect ratio. Annular space 52 between TSV 40 and surrounding region 50 where interconnects or IPDs may be formed, should be wide enough to avoid dielectric breakdown and will depend upon the potentials that may be applied to metal layers or IPDs within region 50 relative to TSV 40 within periphery 51. This will depend upon the particular function being performed by 3-D IC 18 and is within the competence of persons of skill in the art.

FIGS. 4-16 are simplified schematic cross-sectional views of a generalized wafer or chip in which through-substrate-via (TSV) 40 is being formed, during various stages of manufacture, according to still further embodiments of the present invention. Referring now to manufacturing stage 104 of FIG. 4, substrate 54 is provided having initial thickness 55 between upper surface 56 and lower surface 57. Substrate 54 represents any of substrates 20, 30, 30', 34, 34' of FIGS. 1-2. IPD or interconnect zone 58 comprising dielectric layers 59 (e.g., 5 layers are illustrated) and metal layers 60 (e.g., 4 layers are illustrated) are formed on surface 56 of substrate 54 using means well known in the art. The number of dielectric layers 59 and metal layers 60 will depend upon the particular electrical functions being implemented and may be larger or smaller than the numbers of layers illustrated in IPD or interconnect zone 58 of FIGS. 3-16. IPD or interconnect zone 58 represents any or all of AD interconnect zone 26, further interconnect zone 44 if present and/or IPD zone 38. The details of such IPD or interconnect zones are not represented, since they will depend upon the particular circuit configuration and components being implemented. Suitable metals and dielectrics for layers 59 and 60 of interconnect zone 58 are well known in the art. Chemical-mechanical polishing (CMP) stop layer 62 is desirably provided above interconnect zone 58. This stop layer is intended to facilitate subsequent formation of the TSV. Silicon nitride with a thickness of at least about 200 to 1000 nanometers is a non-limiting example of a suitable material for CMP stop layer 62. CMP stop layer 62 is conveniently covered by hard mask layer 64. Deposited silicon oxide of thickness at least of about 2 micrometers is suitable with about 2.4 micrometers thickness of TEOS formed silicon oxide being preferred, but thinner and thicker layers and other materials may also be used. Photoresist mask 66 having opening 67 of width (e.g., diameter) 69 is provided above hard mask 64. Width 69 is conveniently slightly larger than finished TSV width w in order to accommodate several thin liners desirably placed in the TSV cavity before filling it with metal. Structure 204 results.

Figure 4:
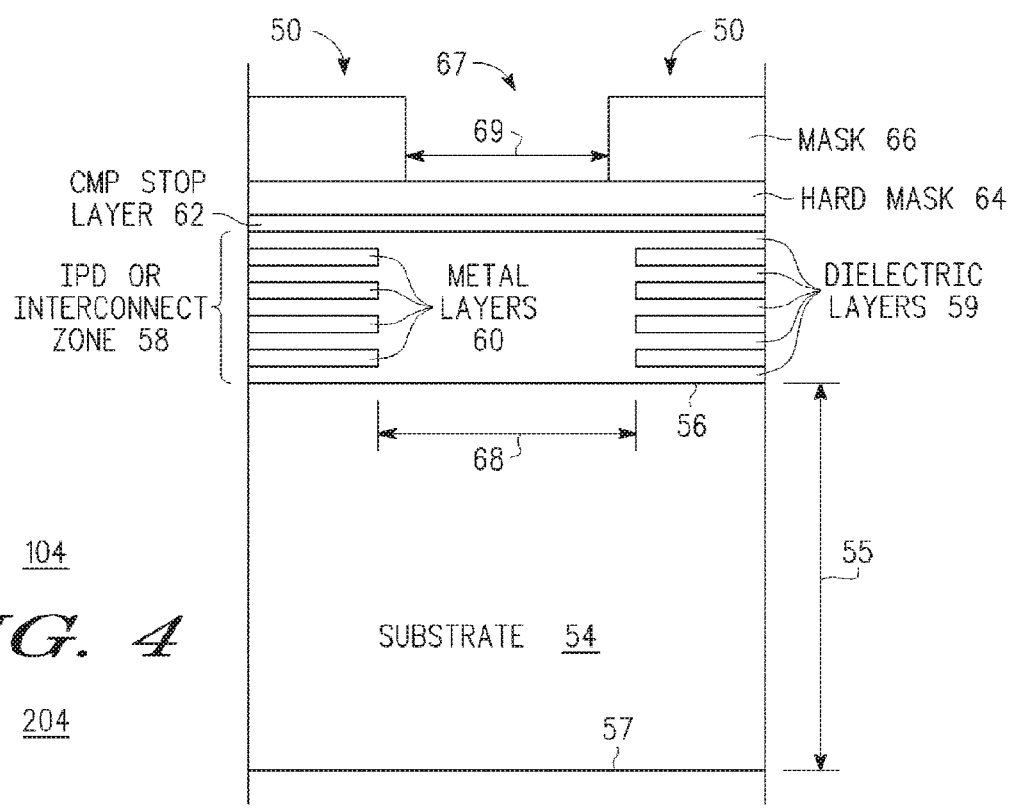
FIGS. 4-16 are simplified schematic cross-sectional view of a generalized wafer or chip in which a through-substrate-via (TSV) is being formed and interconnected to provide a 3D-IC, during various stages of manufacture according to still further embodiments of the present invention.
Figure 5:
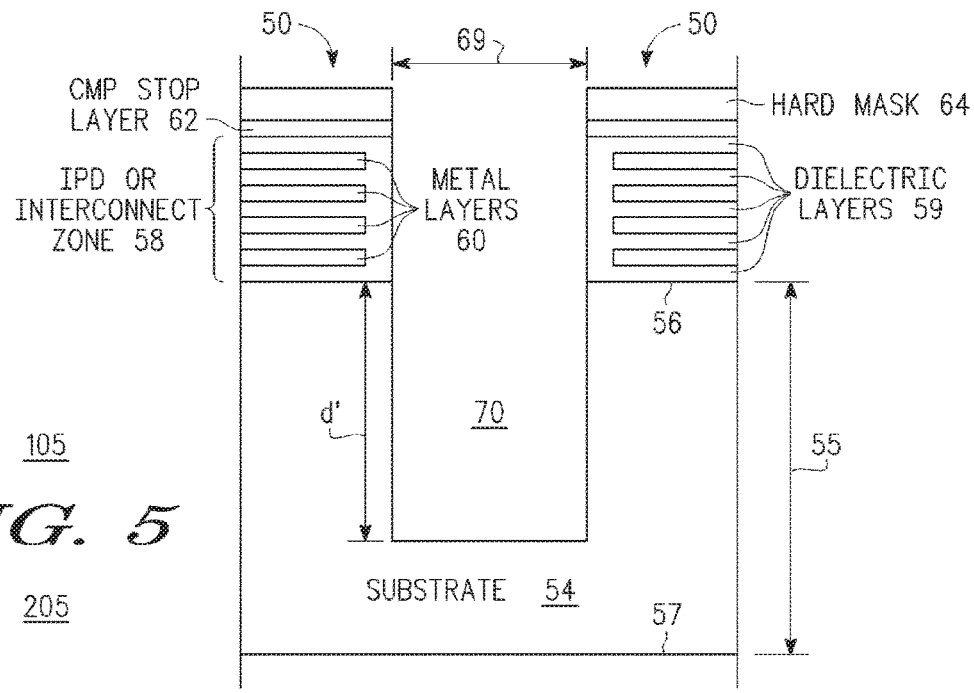

Referring now to manufacturing stage 105 of FIG. 5, using masks 66, 64 of FIG. 4, TSV cavity 70 is etched through IPD or interconnect zone 58 to depth d' below surface 56 in substrate 54. Depth d' is slightly larger than desired finished TSV depth d to accommodate the above-noted liners. Photo-resist mask 66 of FIG. 4 is conveniently used for etching through layers 64, 62 and interconnect zone 58 using means well known in the art depending upon the particular dielectric and metals used therein. Photoresist mask 66 is then conveniently removed in FIG. 5 and hard mask 64 used for etching cavity 70 in substrate 54. For silicon substrates, a plasma etch using alternating etch and polymer deposition steps is a convenient procedure for anisotropic etching of silicon through hard mask 64. The plasma etcher preferably is of the inductively coupled plasma type, the etch step chemistry is based on $SF_6$, and the polymerization step includes polymerizing gases such as $C_4F_8$ or $CHF_3$. However, other well known etch techniques can also be used. Depth d' is chosen depending upon distances 21, 31, 35 needed in finished 3-D IC 18, 18' (see FIGS. 1-2) taking into account the relatively small thickness of cavity liners described in connection with FIG. 6 and the aspect ratio (AR) desired to be maintained. Structure 205 results.

Figure 6:
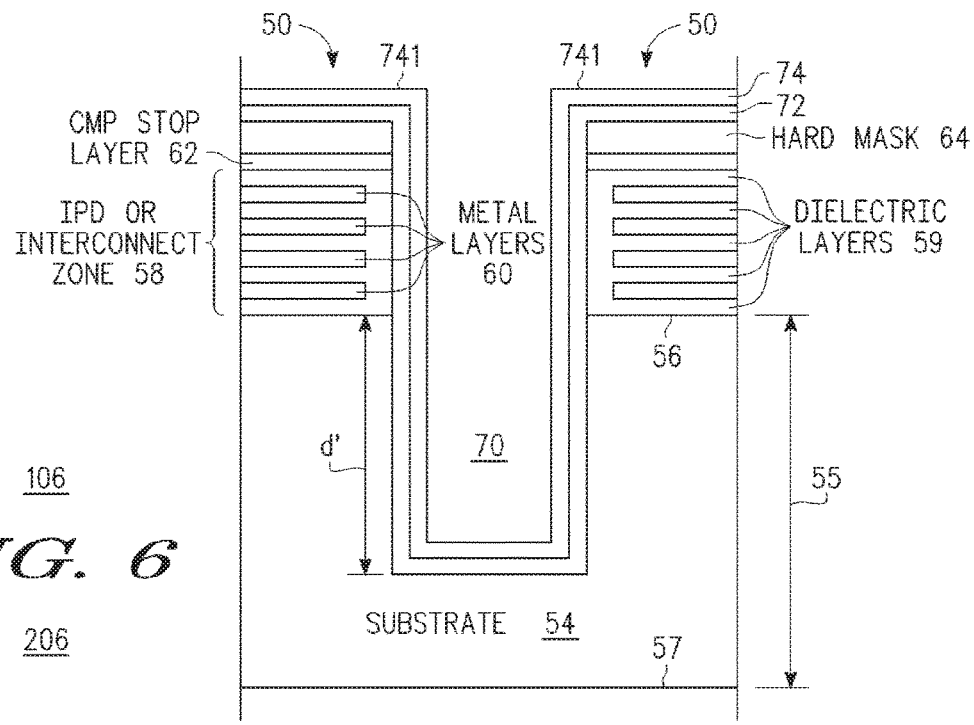

Referring now to manufacturing stage 106 of FIG. 6, substantially conformal dielectric layer 72 is provided in cavity 70 and over mask 64. A sandwich of silicon oxide and silicon nitride is suitable, with silicon nitride preferably having thicknesses about in the range of 20 to 100 nanometers followed by silicon oxide of thickness about in the range of 100 to 1000 nanometers Plasma enhanced chemical vapor deposition (PECVD) is a convenient deposition method, but other layer formation methods well known in the art may also be used. Conformal layer 72 is followed by further substantially conformal layer 74 comprising a barrier layer, preferably of a refractory material, of about 10 to 40 nanometers thickness. Layer 74 has upper surface 741. Where copper is intended to be used for filling TSVs 40 (e.g., by electroplating), it often is desired to first deposit a seed layer of copper using sputtering or other deposition method to about 50 to 100 nanometers thickness, and tantalum is a suitable barrier material. Where tungsten is intended to be used for filling TSVs 40, titanium nitride or a combination of titanium nitride over titanium is a suitable barrier material. Other refractory barrier materials include tantalum nitride. Thinner or thicker layers and other materials can also be used. Structure 206 results.

Figure 7:
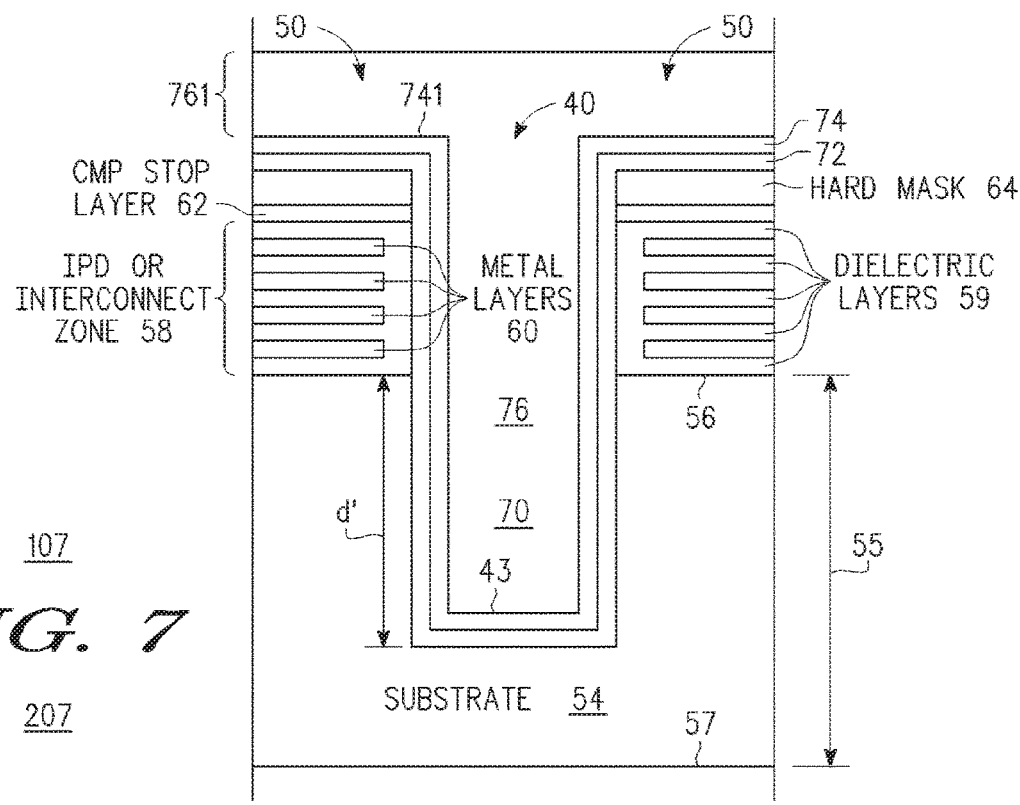
Figure 8:
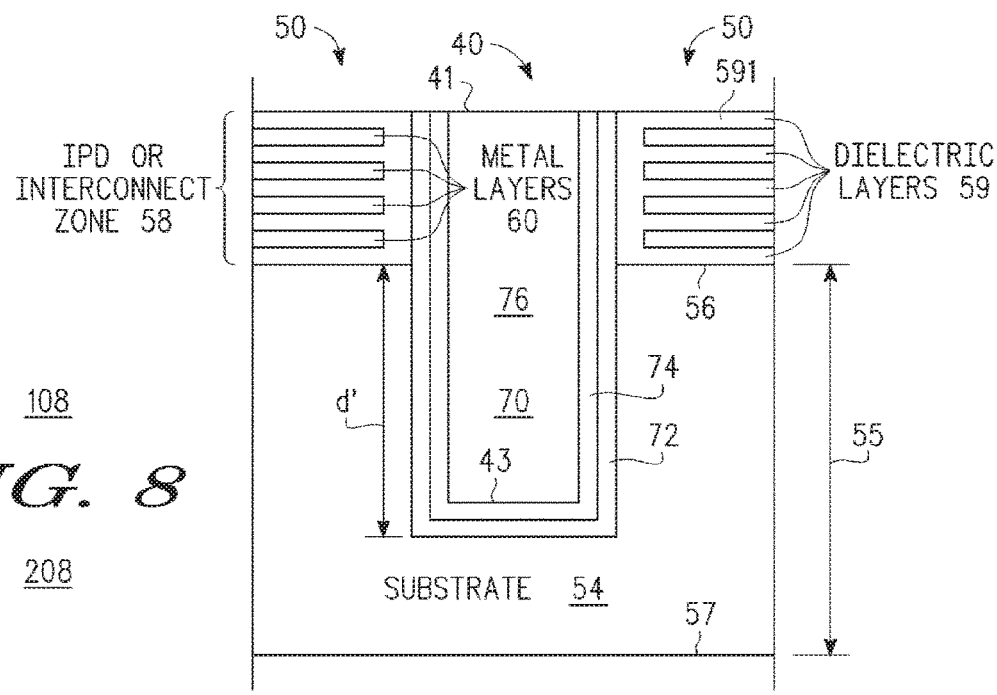
Figure 9:
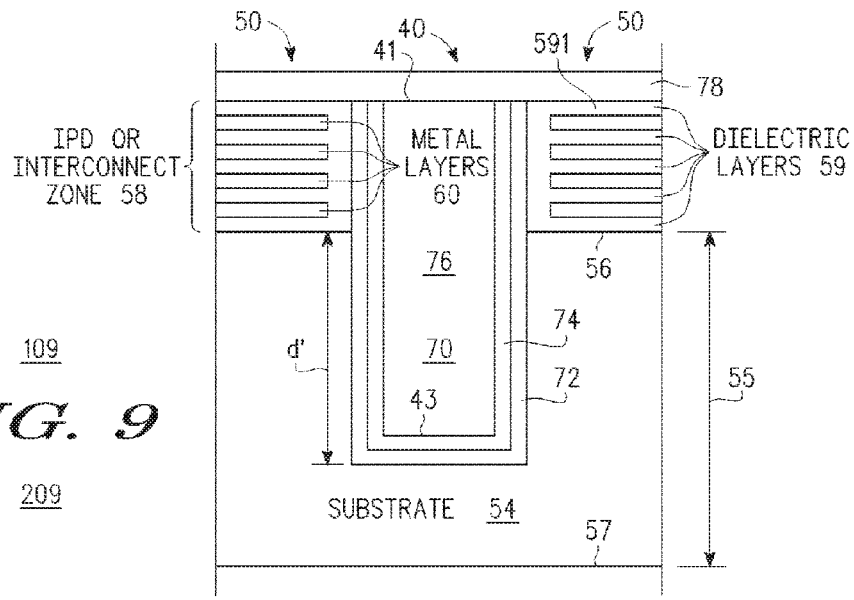

Referring now to manufacturing stage 107 of FIG. 7, TSV cavity 70 is filled with metal 76 by, for example, and not intended to be limiting, chemical vapor deposition (CVD), electroplating or a combination thereof. For tungsten, CVD is suitable. For copper, electroplating is suitable, but other metals and layer formation techniques may also be used. The deposition process also provides portion 761 above layer 74. The thickness of the deposited metal should be sufficient to completely fill TSV cavity 70. Structure 207 results which includes buried face 43 of TSV 40. Referring now to manufacturing stage 108 of FIG. 8, excess metal portion 761 above upper surface 741 of layer 74 is removed, generally by chemical-mechanical polishing (CMP). Additionally, in one embodiment, the portions of layer 72 and the portions of hard mask 64 that overlie the upper surface of CMP stop layer 62 are also removed. CMP stop layer 62 makes it possible to achieve a substantially planar surface with exposed surface 41 of TSV 40 surrounded by a dielectric portion of IPD or interconnect zone 58, e.g., region 591 of dielectric layers 59. Any remaining portions of CMP stop layer 62 may be removed by etching but in other embodiments can be left in place. In still further embodiments, if either layer 72 or hard mask 64 exhibits sufficient CMP stopping properties, then that layer may be sufficient to provide the desired substantially planar surface and CMP stop layer 62 may be omitted. Structure 208 results. Referring now to manufacturing stage 109 of FIG. 9, dielectric passivation layer 78 is applied covering surface 41 of TSV 40 and surrounding dielectric regions 591 of IPD or interconnect zone 58. Silicon oxi-nitride of a thickness of about 300 to 700 nanometers is a suitable material and plasma enhanced chemical vapor deposition (PECVD) is a preferred formation means for forming layer 78, but other materials and larger or smaller thicknesses and other formation techniques may also be used. Passivation layer 78 may include one or more sub-layers. For example, and not intended to be limiting, passivation layer 78 can include a first layer of silicon nitride of 40 to 100 nanometer thickness and a second layer of silicon oxide of 250 to 600 nanometer thickness. Structure 209 results.

Figures 10A, 10B:
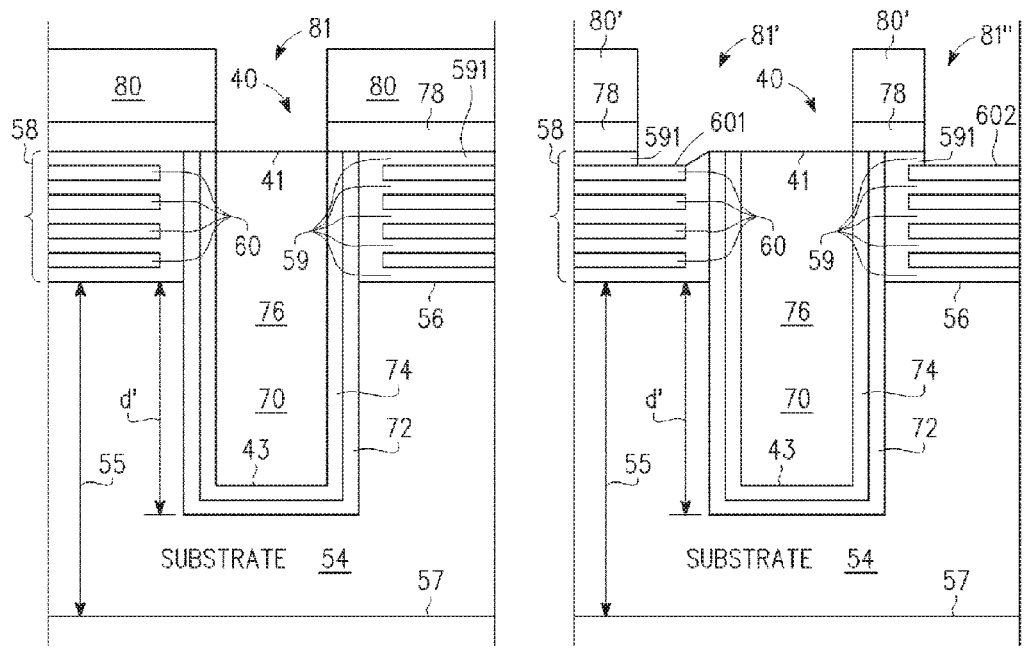
Figure 11A:
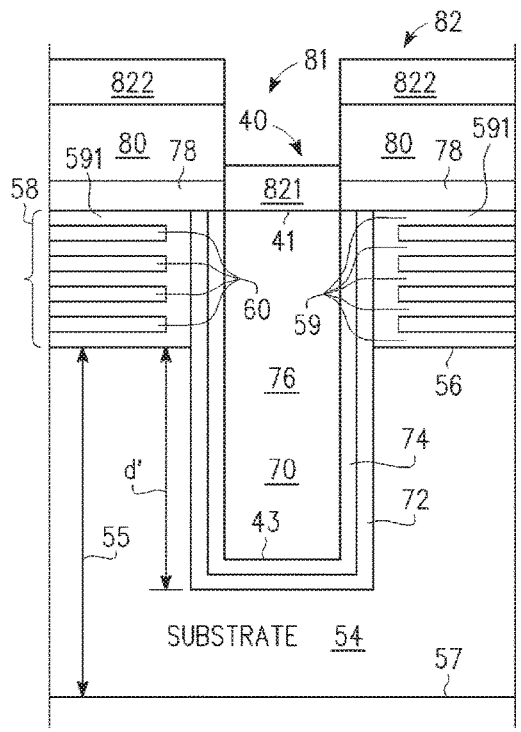
Figure 11B:
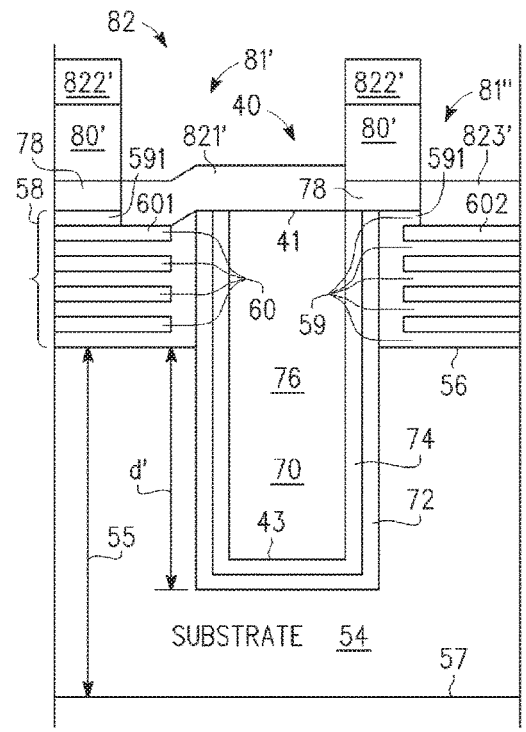
Figure 12A:
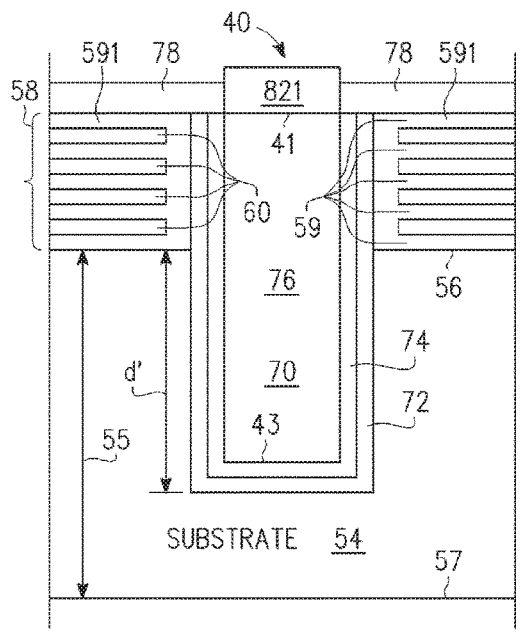
Figure 12B:
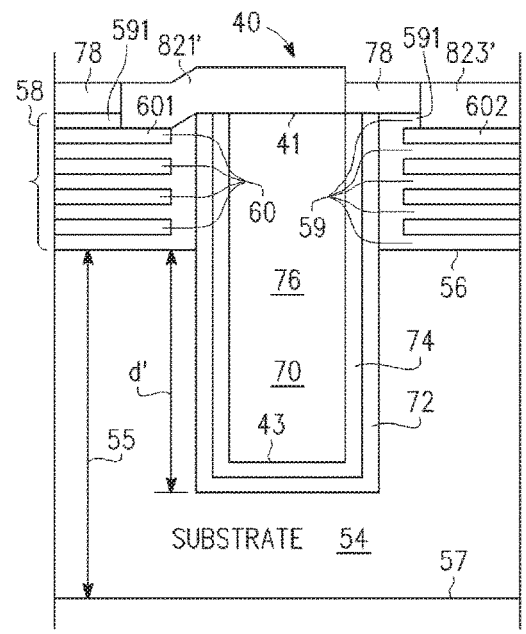

Manufacturing stages 110 through 112 of FIGS. 10-12 illustrate alternate manufacturing stages depending upon the metallization pattern desired to be deposited on surface 41 of TSV 40 and surrounding IPD or interconnect zone 58. In manufacturing stages 110A-112A of FIGS. 10A-12A, metal is deposited only on surface 41 of TSV 40, while in manufacturing stages 110B-112B of FIGS. 10B-12B, metal is deposited so as to couple surface 41 of TSV 40 to a metal layer in IPD or interconnect zone 58 and to provide other connection to one or more metal layers in IPD or interconnect zone 58. Manufacturing stage 110A-112A; 110B-112B of FIGS. 10A-12A and 10B-12B are described together since, other than the mask shapes provided, the steps are similar. Referring now to manufacturing stage 110A and 110B of FIGS. 10A and 10B, mask 80, 80' is provided on dielectric layer 78 and openings 81, 81', 81" provided therein. Dielectric layer 78 is etched away beneath openings 81, 81', 81" to expose underlying metal areas, e.g., surface 41 of TSV 40 and the upper surfaces of metal layer portion 601, 602 in IPD or interconnect zone 58. In manufacturing stages 111A of FIG. 11A and 111B of FIG. 11B, metal 82 is deposited so as to cover the metal surfaces exposed in mask openings 81, 81', 81". Portions 822, 822' of metal 82 overlie mask regions 80, 80' and portions 821, 821', 823' make contact with exposed metal surface 41, and upper metal layer portions 601, 602 in IPD or interconnect zone 58. Structures 211A, 211B result. Referring now to manufacturing stages 112A of FIG. 12A and 112B of FIG. 12B, mask portion 80, 80' are removed, thereby lifting off metal portions 822, 822' leaving in FIG. 12A, metal portion 821 on surface 41 of TSV 40, and in FIG. 12B metal portion 821' on surface 41 of TSV 40 coupled to upper metal layer portion 601 to the left of TSV 40 in IDP or interconnect zone 58, and portion 823' on another part of upper metal layer portion 602 in IDP or interconnect zone 58 to the right of TSV 40 thereby illustrating that connections may be made to various portions of IDP or Interconnect zone 58 during such manufacturing stage. Structures 212A, 212B result. This metallization method is commonly known as a lift-off process and may be selected for use with metals that are difficult to etch such as gold. Other metallization methods as are well known in the art may also be used to fabricate metal portions 821, 821' and 823' shown in FIGS. 12A and 12B. In another embodiment, following deposition of passivation layer 78 as in FIG. 9, mask layer 80 and 80' are deposited and patterned, followed by an etch to form openings 81, 81', and 81", in dielectric layer 78 and portions of the upper dielectric region 591 to expose the upper surface of conductive vias 40 and portions 601, 602 of the upper metal layer in IPD or interconnect zone 58 as shown in FIGS. 10A and 10B. Mask regions 80 and 80' are then removed. A layer of metal 82 is deposited and patterned using photolithography and etching to form the metal portions 821, 821' and 823" as shown in FIGS. 12A and 12B. Structures 212A, 212B result. This method of metallization is commonly known as a subtractive patterning process and is frequently used with aluminum metallization. In a still further embodiment, following deposition of passivation layer 78 as in FIG. 9, mask layer 80 and 80' are deposited and patterned, followed by an etch to form openings 81, 81', and 81", in dielectric layer 78 and portions of the upper dielectric region 591 to expose upper surface 41 of conductive vias 40 and portions 601, 602 of the upper metal layer in IPD or interconnect zone 58 as shown in FIGS. 10A and 10B. Mask layer regions 80 and 80' are then removed. A layer of metal 82 is deposited and patterned using a planarizing CMP process to form the metal portions 821, 821' and 823" as shown in FIGS. 12A and 12B. Structures 212A, 212B result. This method of metallization is commonly known as an inlayed or damascene process. This embodiment is commonly used where it is desired that metal portions 821, 821', and 823' comprise copper with a thickness of one micrometer or less. In yet another embodiment, following deposition of passivation layer 78 as in FIG. 9, mask layer 80 and 80' are deposited and patterned, followed by an etch to form openings 81, 81', and 81", in dielectric layer 78 and portions of the upper dielectric region 591 to expose upper surface 41 of conductive vias 40 and portions 601, 602 of the upper metal layer in IPD or interconnect zone 58 as shown in FIGS. 10A and 10B. Mask regions 80 and 80' are then removed. A thin electroplating metal seed layer is deposited (not shown) followed by the formation of a second mask layer (not shown) with openings having the desired metal pattern with such openings to extend at least over the openings 81, 81', 81". The patterned metal portions 821, 821', and 823" are then formed by electroplating within the openings in the second mask layer using the electroplating metal seed layer as a plating electrode. Following the formation of metal portions 821, 821', and 823', the second mask layer is removed. Then the metal portions 821, 821' and 823' are used as a hard mask in an etch process which removes the exposed portions of the thin electroplating metal seed layer while leaving the portions of the thin electroplating metal seed layer underlying the metal portions 821, 821', and 823'. Structures 212A, 212B result. This method of metallization is commonly known as plating through a mask. This embodiment can be especially beneficial where metal portions 821, 821' and 823' are desirable formed of Cu with a thickness of greater than about 1 micrometer. Metal portions 821, 821' and 823' in any of the above embodiments may include one or more diffusion barrier layers and may also include an interface material to facilitate a subsequent 3-D bonding process. In addition, while FIGS. 4-12 show the formation of TSV 40 as passing thorough the previously formed IPD or interconnect zone 58, TSV 40 can be fabricated following the deposition of the first dielectric layer of IPD or interconnect zone 58. Subsequently, metal layers 60 and remaining dielectric layers of 59 of IPD or interconnect zone 58 are then formed over such TSV 40, and metal portion 821 then formed over IPD or interconnect zone 58 with appropriate design such that metal portion 821 is electrically connected to such TSV 40. Any and all of these embodiments are useful.

Figure 13:
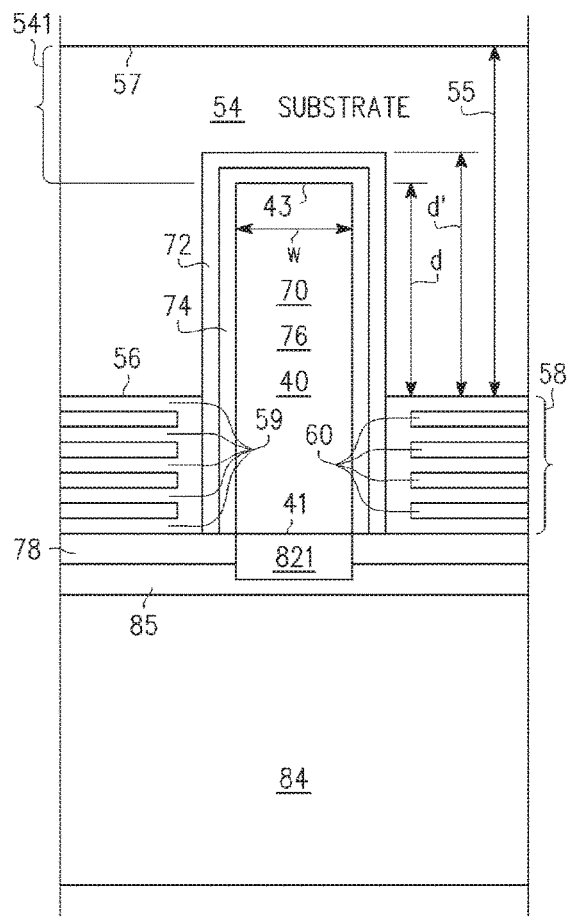
Figure 14:
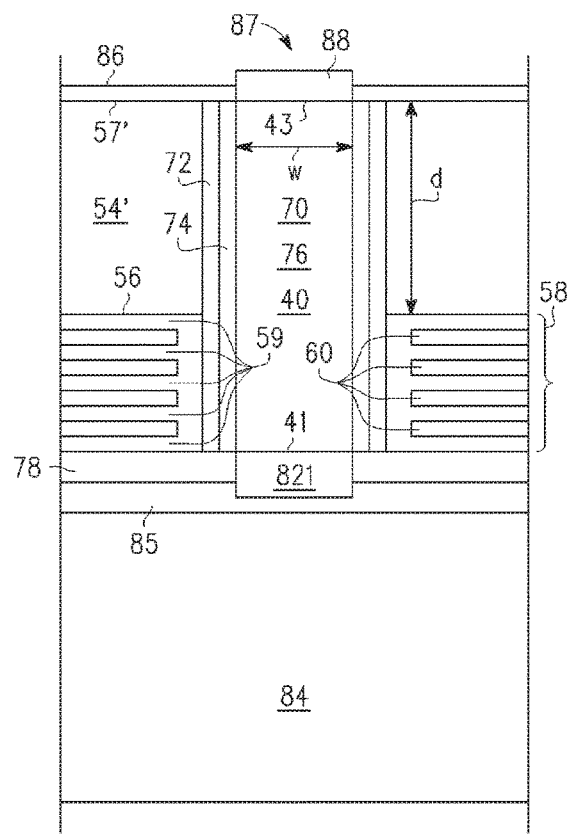
Figure 15A:
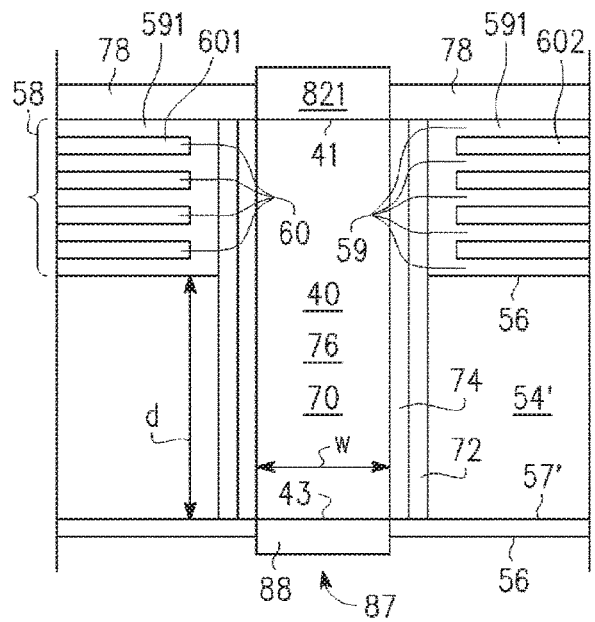
Figure 15B:
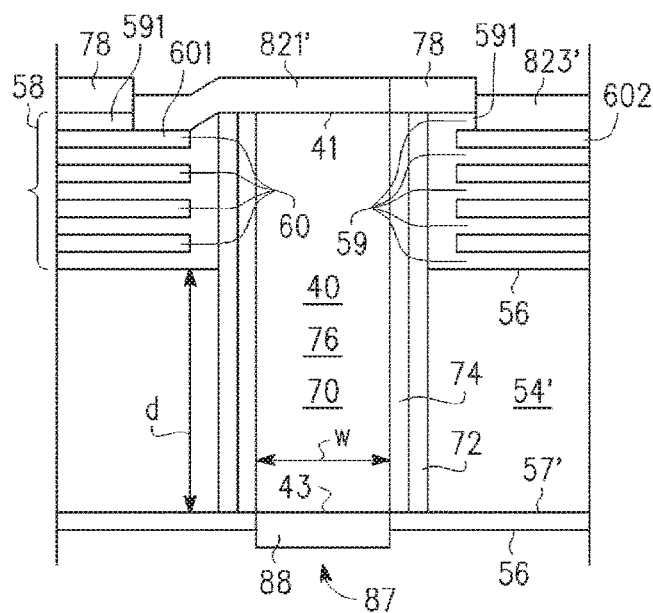

Manufacturing stages 113, 114 of FIGS. 13-14 illustrate how presently buried surface 43 of TSV 40 is exposed and are substantially the same no matter what pattern has been provided for metal 82. For economy of illustration, only the "A" variety structure of FIG. 12A is illustrated in manufacturing stages 113-114 of FIGS. 13-14. Referring now to manufacturing stage 113 of FIG. 13, structure 212A of FIG. 12 is inverted and attached to support 84 by adhesive 85. A variety of well known techniques may be used for mounting structure 212A (or 212B) on support 84 and a variety of materials used for support 84. Glass, ceramic, sapphire and semiconductor wafers are non-limiting examples of materials suitable for support 84 and organic glues and double-sided sticky tape are non-limiting examples of suitable materials for adhesive 85. The preferred method utilizes glass wafers for support 84 and UV sensitive polymers for adhesive 85 as provided by 3M Electronic Markets Materials Division of the 3M Company of St. Paul, Minn. Structure 213 results. Referring now to manufacturing stages 113 of FIG. 13 and 114 of FIG. 14, the purpose of support 84 is to provide mechanical robustness to wafer substrate 54 so that it can be thinned from initial thickness 55 in FIG. 13 to final thickness of about depth d in FIG. 14 so that buried face or surface 43 of TSV 40 is thereby exposed. Wafer substrate 54 is preferably thinned by applying chemical-mechanical polishing (CMP), or a combination of grinding followed by CMP to rear surface 57 of substrate 54 until portion 541 of substrate 54 has been removed to provide thinned substrate 54' on which formerly buried surface or face 43 of TSV 40 is exposed. Other thinning techniques can also be used. As shown in manufacturing stage 114 of FIG. 14, dielectric passivation layer 86 with opening 87 is desirably applied to rear surface 57' of thinned substrate 54' after CMP is complete. Surface 43 of TSV 40 is exposed in opening 87. In an illustrative embodiment, metal region 88 is formed in opening 87 in contact with surface 41 of TSV 40. Structure 214 results. However, in other embodiments, dielectric passivation layer 86 and/or metal region 88 may be omitted, depending upon whether substrate 54, 54' and the particular TSVs being formed therein will be part of AD substrate 20, isolator substrate 30 or IPD substrate 34, and the method used for bonding IPD chip 34, isolator chip 300 and AD chip 200 together to form 3-D IC 18 and/or the method desired to mount 3-D IC 90, 18, 18' to a further circuit board, tape or substrate (not shown). Referring now to manufacturing stages 115A, 115B of FIGS. 15A, 15B, support 84 and adhesive layer 85 are removed from thinned substrate 54', the exact procedure depending upon which adhesive system and support material have been chosen by the manufacturing process designer. In the preferred embodiment using the 3M provided system and materials, infra-red radiation projected through glass support 84 is used to soften adhesive 85 so that thinned substrate 54' with TSVs 40 may be lifted off, and any remaining adhesive 85 may be pealed away. This can be accomplished while thinned substrate 54' is still in wafer form or after singulation while still attached to support 84. Either approach is useful. Structures 215A or 215B result depending upon the lateral shape of mask 80, 80' used in FIGS. 10A, 10B—11A, 11B.

Figure 16:
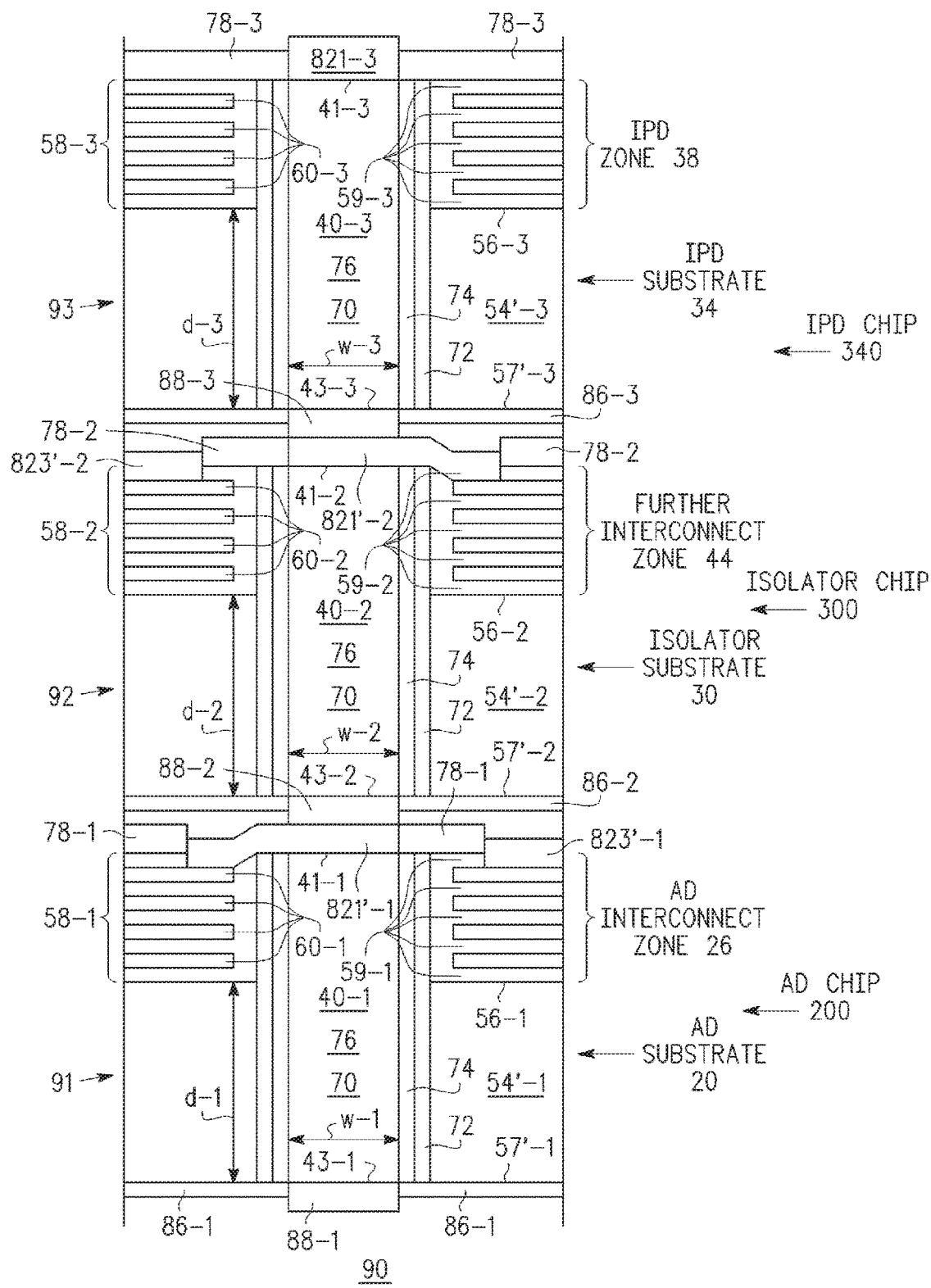

Persons of skill in the art will understand based on the description herein that even though FIGS. 3-15 show only a single TSV, that any number of TSVs 40 can be simultaneously fabricated using the illustrated manufacturing stages in the same substrate at the same time. Further, substrates 54 can be different in both composition and thickness depending upon whether the particular wafer is intended to be an AD substrate 20 wafer with AD interconnect zone 26 thereon, or an isolator substrate 30 wafer (with or without further interconnect zone 44 thereon) or an IPD substrate 34 with IPD zone 38 thereon, but the TSV fabrication process, other than mask pattern changes, will be substantially the same as that illustrated in FIGS. 3-15. Manufacturing stage 116 of FIG. 16 illustrates how different substrates 91, 92, 93 fabricated according to FIGS. 3-15 can be stacked up and interconnected to form 3-D IC 90 analogous to 3-D IC 18, 18' of FIGS. 1-2 (but without the interconnection detail). In FIG. 16, it is presumed that substrate 91 and 92 in 3-D IC stack 90 are type B chips (see FIGS. 10B-12B and 15B) and substrate 93 is a type A chip (see FIGS. 10A-12A and 15A), but this is merely for convenience of illustration and persons of skill in the art will understand that other metallization patterns can equally well be used, with different variations in each of substrates 91, 92, 93 of 3-D IC stack 90 using different IPD or interconnect zones 58-1, 58-2, 58-3 in each substrate to suit the functions required of that level. Accordingly, the custom is adopted, as illustrated immediately above, of adding the suffix -1, -2, -3 to various elements in the different substrates 91, 92, 93 of the stack to indicate that their detailed layout and arrangement can be different according to the function that each level of 3-D IC 90 is performing. By way of example, the functions corresponding to those shown in FIGS. 1-2 are indicated at the right of FIG. 16 for each level.

Manufacturing stage 116 of FIG. 16 shows three substrates 91, 92, 93 stacked one above the other and interconnected to form 3-D IC 90, corresponding to 3-D IC 18, 18' of FIGS. 1-2. Substrate 91 corresponds to AD substrate 20 in combination with IPD or interconnect zone 58-1 corresponding to AD interconnect zone 26. Substrate 91 has one or more TSVs 40-1 of depth d-1 and width w-1 in thinned substrate 54'-1. Substrate 92 corresponds to isolator substrate 30 in combination with IPD or interconnect zone 58-2 corresponding to further interconnect zone 44 if present. Substrate 92 has one or more TSVs 40-2 of depth d-2 and width w-2 in thinned substrate 54'-2. Substrate 93 corresponds to IPD substrate 34 in combination with IDP or interconnect zone 58-3 corresponding to IPD zone 38. Substrate 93 has one or more TSVs 40-3 of depth d-3 and width w-3 in thinned substrate 54'-3. In this example, substrates 91, 92, 93 have mating TSVs 40-1, 40-2, 40-3, wherein metal portion 821'-1 and metal region 88-2 between substrates 91 and 92 couple upper surface 41-1 of TSV 40-1 to metal region 88-2 on lower surface 43-2 of TSV 40-2, and metal portion 821'-2 and metal region 88-3 between substrates 92 and 93 couple upper surface 41-2 of TSV 40-2 to metal region 88-3 on lower surface 43-3 of TSV 40-3. Metal portion 821-3 on upper surface 41-3 of TSV 40-3 is included to illustrate an external bonding pad coupled to the stack of substrates 91, 92, 93 of 3-D IC 90. Surface 43-1 of lower TSV 40-1 with optional metal region 88-1 thereon is also exposed and thereby available to be coupled to an external connection such as, for example, a heat sink to facilitate heat removal from 3-D IC 90, or alternatively an additional electrical connection to the 3-D IC 90. In another embodiment, if no electrical connections to TSV 40-1 in lower substrate 91 is desired, the formation of TSV 40-1 may be omitted as a process simplification with metal portion 821'-1 coupled to AD interconnect zone 26. In another embodiment, electrical connections of 3-D IC 90 can be by connections to the lower surface 43-1 and/or metal region 88-1 of TSV 40-1 in lower substrate 91 rather than to metal portion 821-3 of upper substrate 93. Either arrangement is useful. Substrates 91, 92, 93 may be coupled in a variety of manners in order to provide the inter-level connections illustrated in FIGS. 1-2 and other desired connections. For example, if TSVs 40-1, 40-2, and 40-3 and the metal portions 821'-1, 821'-2 (and/or metal portions 88-2, 88-3) are comprised of copper, the TSVs and metal portions can be electrically and mechanically connected using a thermal-compression bonding process using a temperature in the approximate range of 350° C. to 450° C., and a pressure of a few atmospheres for times in the approximate range of 15 to 60 minutes. For example and not intended to be limiting, the inter-level connections may be formed by providing metal portions 821'-1, 821'-2, 821-3 and/or metal portions 88 that include an interface material to facilitate bonding as is well known in the art. For example metal portions 821'-1, 821'-2, 821-3 and/or 88-1, 88-2, 88-3 can be formed of copper with an interface material comprised of tin or indium which would react with TSVs 40-1, 40-2, and 40-3 and the copper in the metal portion to form an intermetallic compound of copper and tin or copper and indium during a thermal-compression bonding process. The use of the tin or indium interface material allows the thermal compression bonding process to occur at reduced pressure, temperature, and/or time in comparison with the direct thermal-compression of copper-to-copper bonds. In another example, the interface material of 821-1, 821-2, 821-3 and/or metal regions 88-1, 88-2, 88-3 can include a layer of a low temperature solder over a diffusion barrier layer. The use of a low temperature solder may further reduce the temperatures, times and pressures needed to achieve a bond in forming 3-D IC 90, 18, 18', however the resulting bond may have reduced high temperature stability and weaker mechanical properties. In yet another example of use of a bonding process known in the art, ultrasonic bonding may be used with materials such as gold. Metal portions 821'-1, 821'-2, and 821'-3 and/or 88-1, 88-2, 88-3 can be comprised of gold, or be formed of another metal with an interface material which includes a gold layer over a diffusion barrier layer. Likewise TSVs 40-1, 40-2, and 40-3 can have a diffusion barrier and gold interface layer, such as for example, metal regions 88-1, 88-2, 88-3 formed over surfaces 43-1, 43-2, and 43-3. Substrates 91, 92, 93 in either wafer or chip form can be aligned and bonded using either a sequential bonding processes or a simultaneous bonding processes, as are well known in the art. For example, in a useful process, wafer-to-wafer bonding using copper-to-copper or copper/tin thermal-compression bonding can be used to first align and bond substrate 92 to substrate 91, and then subsequently bond substrate 93 to combined substrates 92 and 91. In another useful process using solder interface materials in a chip-to-chip or chip-to-wafer bonding, substrate 92 can be aligned and held in place on substrate 91 using a temporary bond material, followed by placing substrate 93 over substrate 92, and then heating to simultaneously fuse all of TSVs 40 to their mating TSVs or contacts to the IPDs or interconnect metallization of the different levels. Where AD substrate 20 is very thin, for example with thickness 21 in the range of about 10-20 micrometers or less, it is desirable but not essential that bonding of 3-D IC stack 90 be performed before very thin AD substrate 20 is released from support 84. This can be accomplished while substrate 20 is still in wafer form and attached to support 84 and chips 300 and 340 have been singulated and are bonded to substrate 20 still in wafer form attached to support 84 and then substrate 20 with chips 300, 340 attached is singulated to provide 3-D ICs 90, 18, 18'. Alternatively, substrate 200 can be singulated along with support 84 while still attached thereto. Then chips 200, 300, 340 can be bonded together to form 3-D IC 90, 18', 18' and then the singulated portions of support 84 removed from stacked and bonded chips 200, 300, 340. Any and all of these alternative means and methods and combinations thereof may be used to form 3-D IC 90, 18, 18'. Structure 216 results.

In the forgoing discussion it has been assumed that AD chips 200, isolator chips 300 and IPD chips 343 are formed on separate substrates and then stacked and bonded together before or after singulation or a combination thereof. This is a preferred method. However, in a further embodiment that is especially applicable when isolator substrate 30 and IPD substrate 34 can have common physical properties (e.g., similar resistivity and thickness) isolator chips 300 and IPD chips 340 may be formed at the same time in different locations on the same substrate, wherein a first portion of the substrate is used for isolator chips 300 and another portion of the same substrate is used for IPD chips 340. The chips or the two different regions of the common substrate are then singulated or separated and combined with AD chips 200 or AD substrate 20 to form 3-D IC 90, 18, 18'. Where IPD zone 38 and further interconnect region 44 involve multilayer dielectric-metal structures employing similar and/or compatible materials, such combined fabrication is useful. Accordingly, as used herein, the terms "separately formed" and "separately fabricated" and "fabricated (or formed) on separate substrates" are intended to include the variation described here where isolator chips 300 and IPD chips 340 are formed in different locations on a common substrate before singulation or separation.

It will be further recognized that, while the 3-D ICs have been described herein as comprising AD chip 200, isolator chip 300 and IPD chip 340; the present invention applies to other combinations of chips and other chip functions. For example, IPD chip 340 may comprise other elements, passive and/or active, besides integrated passive devices, where it is desired to reduce electromagnetic coupling between devices, conductors, elements or regions on chip 340 and devices, conductors, elements or regions on chip 200 by providing isolator chip 300 therebetween. Accordingly, the terms "integrated passive devices" and the abbreviation "IPD" are intended to include other electronic elements and not be limited merely to passive devices alone, although that is not precluded. Thus, in its broadest sense, the terms "chip 340", "chip (340)", "IPD chip" and "IPD chip 340" or equivalents are intended to include chips with any arrangement of active devices alone, passive devices alone and any combinations of active and passive devices. Thus, IPD zone 38 is not limited merely to include passive devices but may include multilayer metal-dielectric structures or other elements for any purpose and may be referred to as "interconnect zone 38". In the situation where chip 340 is made up of active devices, it can be formed in different regions of a common substrate with the active devices of AD chip 200. Accordingly, in this situation, the terms "separately formed" and "separately fabricated" and "fabricated (or formed) on separate substrates" as used herein are also intended to include the variation described here where IPD chips 340 or third chips 340 and AD chips 200 are formed in different locations on a common substrate before singulation or separation and stacking.

According to a first embodiment, there is provided a 3-D integrated circuit (IC) (90, 18, 18'), comprising, an active device (AD) substrate (20) having an AD region (26) thereon with device contacts therein, an isolator substrate (30), separately formed from the AD substrate (20) and having one or more through-substrate-vias (TSVs) (4030) therein adapted to be coupled to one or more of the device contacts in the AD region (26) of the AD substrate (20), and an integrated passive device (IPD) substrate (34), separately formed from the AD substrate (20) and the isolator substrate (30) and having an IPD zone (38) on its surface in which IPDs have been formed, and having one or more TSVs (4034) there through, adapted to couple one or more of the IPDs in the IPD zone (38) to TSVs (4030) in the isolator substrate (30). According to a further embodiment, at least some of the TSVs (4030) in the isolator substrate (30) are coupled to some of the device contacts in the AD region (26) on the AD Substrate (20). According to a still further embodiment, the IC comprises a further interconnect zone (44) located between the second isolator substrate (30) and the third IPD substrate (34). According to a yet further embodiment, some of the device contacts on the AD substrate (20) are coupled to other device contacts on the AD substrate (20) via the further interconnect zone (44). According to a still yet further embodiment, some of the IPDs are coupled to other of the IPDs via the further interconnect zone (44). According to a yet still further embodiment, at least one of the IPDs has a first element located in the IPD zone (38) and a second element located in the further interconnect zone (44). According to another embodiment, the isolator substrate (30) has a resistivity of a 1000 ohm-cm or greater. According to a still another embodiment, the isolator substrate (30) has a thickness in the range of about 10 and 200 micrometers or larger. According to a yet another embodiment, the IPD substrate (34) has a resistivity of a 1000 ohm-cm or greater. According to a still yet another embodiment, the isolator substrate (30) has a thickness in the range of about 10 and 200 micrometers or larger. According to a yet still another embodiment, the AD substrate (20) has a first thickness (21), the isolator substrate (30) has a second thickness (31) and the IPD substrate (34) has a third thickness (35), and at least one or both of the second (31) and third thickness (35) are at least about 2-20 times the first thickness (21).

According to a second embodiment, there is provided a method for forming a 3-D integrated circuit (IC) (90, 18, 18'), comprising, forming on separate substrates (20, 30, 34) at least an active device chip (200), an isolator chip (300) and an integrated passive device (IPD) chip (340), wherein at least two of such chips (200, 300, 340) have one or more conductor filled vias (40) extending there through and wherein at least some vias in the IPD chip (340) are coupled to one or more integrated components on the IPD chip (340), stacking the active device chip (200), the isolator chip (300) and the IPD chip (340) so that a first via in a first of the at least two chips is aligned with a second via in another of the at least two chips; and bonding the active device chip (200), the isolator chip (300) and the integrated passive device (IPD) chip (340) together so that the first and second vias are electrically coupled. According to a further embodiment, the forming step comprises, forming the active device chip (200), the isolator chip (300) and the IPD chip (340) with one or more levels of interconnects (26, 44, 38) on first surfaces thereof, some of which are coupled during the bonding step with one or more vias (40) exposed on a rear face of a chip to which it is being bonded in the bonding step. According to a still further embodiment, the forming step comprises, providing an initial substrate (54) having a front face (56) and a rear face (57), etching a blind via cavity (70) in the initial substrate (54) extending from the front face (56) toward the rear face (57), filling the blind cavity (70) with a conductor (76) having an interior surface (43) proximate a bottom of the cavity (70), removing excess conductor (761) from above the blind cavity (70) to expose a first face (41) of the conductor (76) filling the blind cavity (70), mounting the substrate (54) on a support (84) with the first face (41) toward the support (84), removing material from the rear face (57) of the initial substrate (54) thereby providing a thinned substrate (54') having therein a conductor filled via (40) of depth d extending there through and with the first face (41) and the interior surface (43) of the conductor (76) in the cavity (70) exposed, and removing the support (84) from the thinned substrate (54'). According to yet further embodiment, the method further comprises providing an interconnect zone (58) on the front face (56) of the initial substrate (54), and wherein the step of removing excess conductor (761) comprises removing excess conductor (761) over the interconnect zone (58).

According to a third embodiment, there is provided a 3-D integrated circuit (IC), comprising, an active device chip (200) formed on an active device substrate (20) having an active device interconnect zone (26, 58-1) on a first face (22, 56-1) thereof and one or more first conductor filled vias (4020, 40-1) extending from the first face (22, 56-1) to an opposite second face (23, 57-1) thereof, an isolator chip (300) formed on an isolator substrate (30) having a further interconnect zone (44, 58-2) on a first face (32, 56-2) thereof coupled to one or more second conductor filled vias (4030, 4030', 40-2) extending from the first face (32, 56-2) to an opposite second face (33, 57'-2) thereof, a third chip (340) containing integrated passive devices or other elements or both formed on a third substrate (34) and having an interconnect zone (38, 58-3) on a first face (36, 56-3) thereof coupled to one or more third conductor filled vias (4034, 4034', 40-3) extending from the first face (36, 56-3) to an opposite second face (37, 57'-3) thereof, and wherein the active device chip (200), the isolator chip (300) and third chip (340) are bonded together so that at least some of the third conductor filled vias (4034, 4034', 40-3) are coupled to at least some of the second conductor filled vias (4030, 4030', 40-2). According to a further embodiment, at least some of the second conductor filled vias (4030, 4030', 40-2) are coupled to one or more of the first conductor filled vias (4020, 40-1). According to a still further embodiment, the active device interconnect zone (26, 58-1) on the active device chip (200) couples at least one of the active devices on the active device chip (200) to one or more of the first conductor filled vias (4020, 40-1).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A structure comprising circuitry for operation at one or more frequencies at least as high as a radio frequency, the circuitry comprising:
   one or more active devices; and
   one or more passive devices electrically coupled to the one or more active devices;
   wherein the structure comprises:
   a first semiconductor substrate comprising at least part of the one or more active devices;
   a second semiconductor substrate overlying the first semiconductor substrate and supporting at least part of the one or more passive devices located over the second semiconductor substrate; and
   a third semiconductor substrate located between the first and second semiconductor substrates;
   wherein the circuitry further comprises one or more conductive paths passing through the second and third semiconductor substrates and electrically coupling the one or more passive devices to the one or more active devices;
   wherein the third semiconductor substrate is a semiconductor material reducing electromagnetic coupling between the one or more passive devices and the one or more active devices at least at one of the one or more frequencies; and
   wherein the second semiconductor substrate is a semiconductor material reducing electromagnetic coupling between the one or more passive devices and the one or more active devices at least at one of the one or more frequencies.

2. The structure of claim 1 wherein:
said at least part of the one or more active devices is spaced from a bottom of the first semiconductor substrate; and
the structure further comprises a heat sink attached to the bottom of the first semiconductor substrate.

3. The structure of claim 2 wherein the first semiconductor substrate is two or more times thinner than each of the second and third semiconductor substrates.

4. The structure of claim 1 wherein:
said at least part of the one or more active devices is located at a top of the first semiconductor substrate; and
the first semiconductor substrate is two or more times thinner than each of the second and third semiconductor substrates.

5. The structure of claim 4 further comprising a heat sink attached to a bottom of the first semiconductor substrate.

6. The structure of claim 1 wherein the circuitry is a power amplifier for operation at said one or more frequencies.

7. The structure of claim 1 wherein at least one said passive device comprises an element operating as a transmission line at least at one of the one or more frequencies, the transmission line comprising a first conductive strip and a second conductive strip, the first conductive strip overlying the second semiconductor substrate, the second conductive strip being between the second and third semiconductor substrates.

8. The structure of claim 1 wherein at least one said device comprises a first conductive strip and a second conductive strip, the first conductive strip overlying the second semiconductor substrate, the second conductive strip being between the second and third semiconductor substrates, the first and second conductive strips being a differential signal pair.

9. The structure of claim 1 wherein at least one said passive device comprises one or more inductor loops overlying the second semiconductor substrate.

10. The structure of claim 9 wherein said at least one said passive device comprising the one or more inductor loops also comprises a ground plane between the second and third semiconductor substrates, the ground plane being patterned, the ground plane being for reducing eddy current losses at least at one of the one or more frequencies.

11. The structure of claim 1 further comprising an electromagnetic band gap structure located between the second and third semiconductor substrates to enhance shielding of the first semiconductor substrate and said at least part of the one or more active devices from said at least part of the one or more passive devices at least at one of the one or more frequencies.

12. The structure of claim 1 wherein the semiconductor material of the third semiconductor substrate is at least as effective as a silicon material having a resistivity of at least 1000 ohm-cm in reducing the electromagnetic coupling between the one or more passive devices and the one or more active devices at least at said corresponding one of the one or more frequencies.

13. The structure of claim 1 wherein the semiconductor material of the second semiconductor substrate is at least as effective as a silicon material having a resistivity of at least 1000 ohm-cm in reducing the electromagnetic coupling between the one or more passive devices and the one or more active devices at least at said corresponding one of the one or more frequencies.

14. A method comprising operating, at one or more frequencies which are at least as high as a radio frequency, a circuitry comprising:
one or more active devices; and
one or more passive devices electrically coupled to the one or more active devices;
wherein at least part of the one or more active devices is located in a first semiconductor substrate;
at least part of the one or more passive devices is located over a second semiconductor substrate overlying the first semiconductor substrate; and
a third semiconductor substrate is located between the first and second semiconductor substrates;
wherein the circuitry comprises one or more conductive paths passing through the second and third semiconductor substrates and electrically coupling the one or more passive devices to the one or more active devices;
wherein the third semiconductor substrate is a semiconductor material reducing electromagnetic coupling between the one or more passive devices and the one or more active devices at least at one of the one or more frequencies; and
wherein the second semiconductor substrate is a semiconductor material reducing electromagnetic coupling between the one or more passive devices and the one or more active devices at least at one of the one or more frequencies.

15. The method of claim 14 wherein:
said at least part of the one or more active devices is spaced from a bottom of the first semiconductor substrate; and
a heat sink is attached to the bottom of the first semiconductor substrate.

16. The method of claim 15 wherein the first semiconductor substrate is two or more times thinner than each of the second and third semiconductor substrates.

17. The method of claim 14 wherein:
said at least part of the one or more active devices is located at a top of the first semiconductor substrate; and
the first semiconductor substrate is two or more times thinner than each of the second and third semiconductor substrates.

18. The method of claim 14 wherein the circuitry is a power amplifier.

19. The method of claim 14 wherein at least one said passive device comprises a transmission line comprising a first conductive strip and a second conductive strip, the first conductive strip overlying the second semiconductor substrate, the second conductive strip being between the second and third semiconductor substrates.

20. The method of claim 14 wherein at least one said device comprises a first conductive strip and a second conductive strip, the first conductive strip overlying the second semiconductor substrate, the second conductive strip being between the second and third semiconductor substrates, the first and second conductive strips being a differential signal pair.

21. The method of claim 14 wherein at least one said passive device comprises one or more inductor loops overlying the second semiconductor substrate, and also comprises a patterned ground plane between the second and third semiconductor substrates, the ground plane reducing eddy current losses.

22. The method of claim 14 further comprising an electromagnetic band gap structure located between the second and third semiconductor substrates and enhancing shielding of the first semiconductor substrate and said at least part of the one or more active devices from said at least part of the one or more passive devices.

23. The method of claim 14 wherein the semiconductor material of the third semiconductor substrate is at least as effective as a silicon material having a resistivity of at least 1000 ohm-cm in reducing the electromagnetic coupling between the one or more passive devices and the one or more active devices at least at said corresponding one of the one or more frequencies.

24. The method of claim 14 wherein the semiconductor material of the second semiconductor substrate is at least as effective as a silicon material having a resistivity of at least 1000 ohm-cm in reducing the electromagnetic coupling between the one or more passive devices and the one or more active devices at least at said corresponding one of the one or more frequencies.

* * * * *